United States Patent
Moon et al.

(10) Patent No.: US 7,130,357 B2
(45) Date of Patent: Oct. 31, 2006

(54) APPARATUS AND METHOD FOR COMPENSATING ERROR FOR ANALOG QUADRATURE MODULATOR (AQM)

(75) Inventors: Jin-Sub Moon, Seoul (KR); Woo-Sik Kim, Seoul (KR)

(73) Assignee: LG-Nortel Co., Ltd., Seoul (KR)

( * ) Notice: Subject to any disclaimer, the term of this patent is extended or adjusted under 35 U.S.C. 154(b) by 755 days.

(21) Appl. No.: 10/327,040

(22) Filed: Dec. 24, 2002

(65) Prior Publication Data

US 2003/0118126 A1    Jun. 26, 2003

(30) Foreign Application Priority Data

Dec. 26, 2001    (KR)    ............... 10-2001-0085444

(51) Int. Cl.
*H04K 1/02*    (2006.01)
*H04B 1/04*    (2006.01)

(52) U.S. Cl. .................. 375/296; 375/297; 455/114.3; 455/126

(58) Field of Classification Search ................ 375/296, 375/297; 455/126, 114.2, 114.3; 330/107, 330/129, 149; 332/103, 159, 162
See application file for complete search history.

(56) References Cited

U.S. PATENT DOCUMENTS 5,732,333 A * 3/1998 Cox et al. .................... 455/126

6,081,158 A   6/2000 Twitchell et al. ........... 330/149
6,515,712 B1* 2/2003 Jeong ......................... 348/608
2002/0018531 A1* 2/2002 Ratto ......................... 375/297

FOREIGN PATENT DOCUMENTS

CN    1206251 A    1/1999

OTHER PUBLICATIONS

Office Action issued by the Patent Office of the People's Republic of China on May 20, 2005 (English Full Text & Chinese Full Text).

* cited by examiner

*Primary Examiner*—Don N. Vo
(74) *Attorney, Agent, or Firm*—Fleshner & Kim, LLP

(57) ABSTRACT

An apparatus and a method for compensating an error of an AQM measuring and compensating the error using returned I/Q digital signals calculate the error compensating signal is disclosed. The process includes detecting a DC offset signal by averaging sampling values of returned I/Q digital signals; detecting a gain compensating signal using a maximum value in a period of the I/Q digital signals of which the DC offset is compensated; and detecting a phase compensating value of the I/Q digital signals on the basis of sum of absolute values for differences between the gain compensated I-digital signals and Q-digital signals, and remove phase error, gain error and DC offset of the inputted digital signal sequentially to compensate the AQM error.

32 Claims, 6 Drawing Sheets

APPARATUS AND METHOD FOR COMPENSATING ERROR FOR ANALOG QUADRATURE MODULATOR (AQM)

BACKGROUND OF THE INVENTION

1. Field of the Invention

The present invention relates to an analog quadrature modulator (AQM), and more particularly to an apparatus and a method for compensating an error for an AQM.

2. Background of the Related Art

A power amplifier is used to amplify a high frequency signal. A power amplifier that amplifies only a strength of a signal linearly without distorting the signal is an ideal power amplifier. However, power amplifiers include a plurality of active elements that have nonlinear characteristics. Therefore, the amplified signal can be distorted, and a function of an entire system is severely affected.

To improve the nonlinear characteristics of the power amplifier, various corrections have been suggested. These include a feed forward method, an envelope feedback method, a predistortion method, and a bias compensation method. The predistortion method is frequently used since it is inexpensive for its function and can operate in wider bandwidth.

The predistortion method is able to improve the linearity of the system by predistorting an input signal to have opposite characteristics of the nonlinear distortion characteristic of the power amplifier. Also, the predistortion method can be realized on a baseband. Consequently a size of the entire system can be miniaturized and the efficiency can be improved.

In order to realize a wider predistortion system, the entire system is implemented using AQM rather than using digital quadrature modulation (DQM). However, the AQM system is constructed using analog elements, and includes error components such as DC offset and amplitude/phase imbalance. These are the principal elements that degrade the function of predistorter. Therefore, the error of the AQM should be compensated in order to get optimal function of the predistorter.

FIG. 1 is a diagram showing a related art error compensating apparatus for the AQM. As shown in FIG. 1, a path from the predistorter 110 to a directional coupler 105 is a main path on which a signal is transmitted. A path from the directional coupler 105 to a controller 107 is a feedback path for detecting an error generated in the AQM. The error is generated in the AQM due to the DC offset or the amplitude/phase imbalance.

The related art error compensating apparatus for the AQM includes a predistorter 110 for distorting a signal to have an opposite characteristic of the nonlinear characteristic of a digital input signal, and an error compensating unit 120 for compensating I/Q digital signals outputted from the predistorter 110 by as much as an error compensating signal. The apparatus further includes first and second digital/analog converters 102 and 103 for converting the I/Q digital signals outputted from the error compensating unit 120 into I/Q analog signal respectively, and a modulator 130 for modulating frequencies of the analog signal outputted from the first and second D/A converters 102 and 103. Next, a power amplifier 104 is provided for amplifying the output signal of the modulator 130 and supplying the signal to the directional coupler 105. The apparatus further includes a down converter 140 for down converting a returning signal branched in the directional coupler 105, an analog/digital converter 106 for converting the output signal of the down converter 140 into a digital signal and a controller 107 for detecting an error compensating value by comparing the output signal (Vfb) of the analog/digital converter 106 to the I/Q digital signals (Vref) inputted from the predistorter 110, and applying the error compensating signal according to the value to the error compensating unit.

The error compensating unit 120 is an equivalent circuit of the modulator 130, and includes a first amplifier 121 for controlling gain of an I-digital signal, which is predistorted according to a first gain compensating signal ($\alpha$) transmitted from the controller 107, and a second amplifier 122 for controlling gain of a Q-digital signal, which is predistorted according to a second gain compensating signal ($\beta$) transmitted from the controller 107. The compensating unit 120 further includes a third amplifier 123 for controlling a phase of an output signal from the second amplifier 122 according to a first phase compensating signal (sin $\phi$), and a fourth amplifier 125 for controlling a phase of an output signal from the second amplifier 122 according to a second phase compensating signal (cos $\phi$). Additionally included are a first adder 124 for adding output signals of the first amplifier 121 and the third amplifier 123, a second adder 126 for adding an output signal of the first adder 124 and a first DC offset signal (C1), and a third adder 127 for adding an output signal of the fourth amplifier 125 and a second DC offset signal (C2).

The modulator 130 inlcudes a first multiplier 131 for multiplying an I-analog signal outputted from the first D/A converter 102 by a local oscillator frequency outputted from a local oscillator, a second multiplier 132 for multiplying a Q-analog signal outputted from the second D/A converter 103 by the local oscillator signal outputted from the local oscillator and phase converted as 90°, and a combiner 133 for combining the output signals of the first and second multipliers 131 and 132 and outputting a high frequency signal.

The controller 107 calculates an AQM error using a reference signal (Vref) inputted from the predistorter 110 and a signal (Vfb) returned from the directional coupler 105, and compensates the respective errors.

An operation of the related art error compensating apparatus for the AQM will be described as follows.

First, the predistorter 110 controls a level of an inputted digital signal, and inputs the signal into the error compensating unit 120 after distorting the signal into I/Q digital signals having opposite characteristics of the nonlinear characteristics of the power amplifier.

The error compensating unit 120 compensates the error of the I/Q digital signals outputted from the predistorter 110 and applies the signal to the first and second D/A converters 102 and 103. The first and second D/A converters 102 and 103 then output the inputted I/Q digital signals after converting them into I/Q analog signals.

The modulator 130 receives the I/Q analog signals outputted from the first and second D/A converters 102 and 103 and AQM modulates the signals. That is, the first multiplier 131 of the modulator 130 up converts the I-analog signal outputted from the first D/A converter 102 by multiplying the signal by the local oscillator signal outputted from the local oscillator, and the second multiplier 132 up converts the Q-analog signal outputted from the second D/A converter 103 by multiplying the signal by a signal having phase difference of $\pi/2$ from the local oscillator signal. The respective signals which were up converted are combined as a high frequency signal in the combiner and applied to the power amplifier 104.

The down converter 140 down converts the frequency of a signal which is branched and returned from the directional coupler 105 after passing through the power amplifier 104, and applies the signal to the A/D converter 106. The A/D converter 106 converts the output signal of the down converter 140 into the digital signal outputs it into the controller 107.

The controller 107 detects the error value by performing a predetermined calculation with the I/Q digital signals (Vref) inputted from the predistorter 110 and the I/Q digital signals (Vfb) received from the A/D converter 106. The error compensating signal is then applied to the error compensating unit 120 for compensating the error value. The error compensating unit 120 compensates the error of the I/Q digital signals according to the error compensating signal and outputs the compensated signal.

A process of detecting the error compensating signal by the controller will be described in additional detail as follows.

The controller 107 detects respective DC offsets (C1 and C2) from the returned I/Q digital signals, removes the DC offset for the returned I/Q digital signals, and calculates gain compensating signals ($\alpha$ and $\beta$) by comparing the I/Q digital signals, from which the DC offset is removed, to the I/Q digital signals (Vref), which is a reference signal inputted from the predistorter 110. The gain is thereby compensated.

A time delay value is detected by using the gain compensated I-digital signal and the I-digital signal, which is a reference signal inputted through the predistorter 110. After that, the controller compensates the time delay of the gain compensated I/Q digital signals. In addition, the phase compensating value ($\phi$) is detected by using the Q-digital signal, of which the time delay is compensated, and using the Q-digital signal, which is a reference signal inputted through the predistorter 110. The Q-digital signal, of which the time delay is compensated, is compensated by as much as the phase compensating value.

The error compensating unit 120, which received the error compensating signal detected through above processes, compensates the gain of the I/Q digital signals through the first and second amplifiers 121 and 122. It also compensates the phase error of the I/Q digital signals through the third and fourth amplifiers 123 and 125, and compensates the DC offset of the I/Q digital signals through the second and third adders 126 and 127. Finally it outputs the digital signal.

As described above, the related art AQM error compensating apparatus has various problems. For example, the AQM error compensating apparatus detects the error compensating signal by comparing the reference digital signal inputted from the predistorter to the returned digital signal. Therefore, memories for storing the respective digital signals are needed. In addition, the time delay must be precisely compensated before calculating the AQM error value. That is, the error in the time delay affects to the gain and phase error values. Therefore, the time delay should be precisely compensated. However, it is difficult to realize the precise time delay compensation.

In addition, in the related art AQM compensating apparatus, in order to detect a precise phase compensating value, many interpolations are required. However, it is difficult to get many interpolations due to the memory limit in the controller.

Also, in the related art AQM error compensating apparatus, the error compensating unit performs the gain compensation of the inputted digital signal earlier than the phase compensation. Therefore, independent functions between the gain and phase are not performed, and accuracy of the compensating function is reduced.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide an apparatus and a method for compensating an error for an analog quadrature modulator (AQM) which is able to detect an error using a returned I/Q digital signals and compensate the error.

Another object of the present invention is to provide an apparatus and a method for compensating an error for an AQM which measures and compensates an error using returned I/Q digital signals.

Another object of the present invention is to provide an apparatus and a method for compensating an error for an AQM which is able to compensate an AQM error precisely by performing a phase compensation earlier than a gain compensation to grant independent functions between the gain and phase.

To achieve at least these objects in whole or in parts, there is provided an error compensating apparatus for an AQM, including a predistorter for distorting a nonlinear distortion characteristic of a digital input signal to have opposite characteristic; an error compensating unit for compensating an I/Q digital signals outputted from the predistorter according to an error compensating signal; a digital/analog converter for converting the I/Q digital signals of the error compensating unit into I/Q analog signals respectively; a modulator for frequency modulating the I/Q analog signals outputted from the digital/analog converter; a power amplifier for amplifying an output signal of the modulator and supplying the signal to a directional coupler; a down converter for down converting frequency of a signal returned from the directional coupler; an analog/digital converter for digital converting an output signal of the down converter; a demodulator for outputting the digital signal of the analog/digital converter as dividing it into I/Q digital signals; and a digital signal processor for applying an error compensating signal, which is detected by calculating the I/Q digital signals outputted from the demodulator, to the error compensating unit.

Additionally, to achieve at least the above objects in whole or in parts, there is provided an error compensating method for an AQM including dividing a returned digital signal into I/Q digital signals and outputting the signals; calculating an error compensating signal by performing a predetermined calculation with the I/Q digital signals; and compensating an error of an inputted signal by applying the calculated error compensating signal.

Additionally, to achieve at least the above objects in whole or in parts, there is provided an error compensating method for an AQM including detecting a DC offset signal by averaging sampling values of returned I/Q digital signals; detecting a gain compensating signal using a maximum value in a period of the I/Q digital signals of which the DC offset is compensated; detecting a phase compensating value of the I/Q digital signals on the basis of sum of absolute values for differences between the gain compensated I-digital signals and Q-digital signals; of compensating the AQM error by removing a gain error and the DC offset, after compensating phase error of the inputted digital signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

Figure 1:
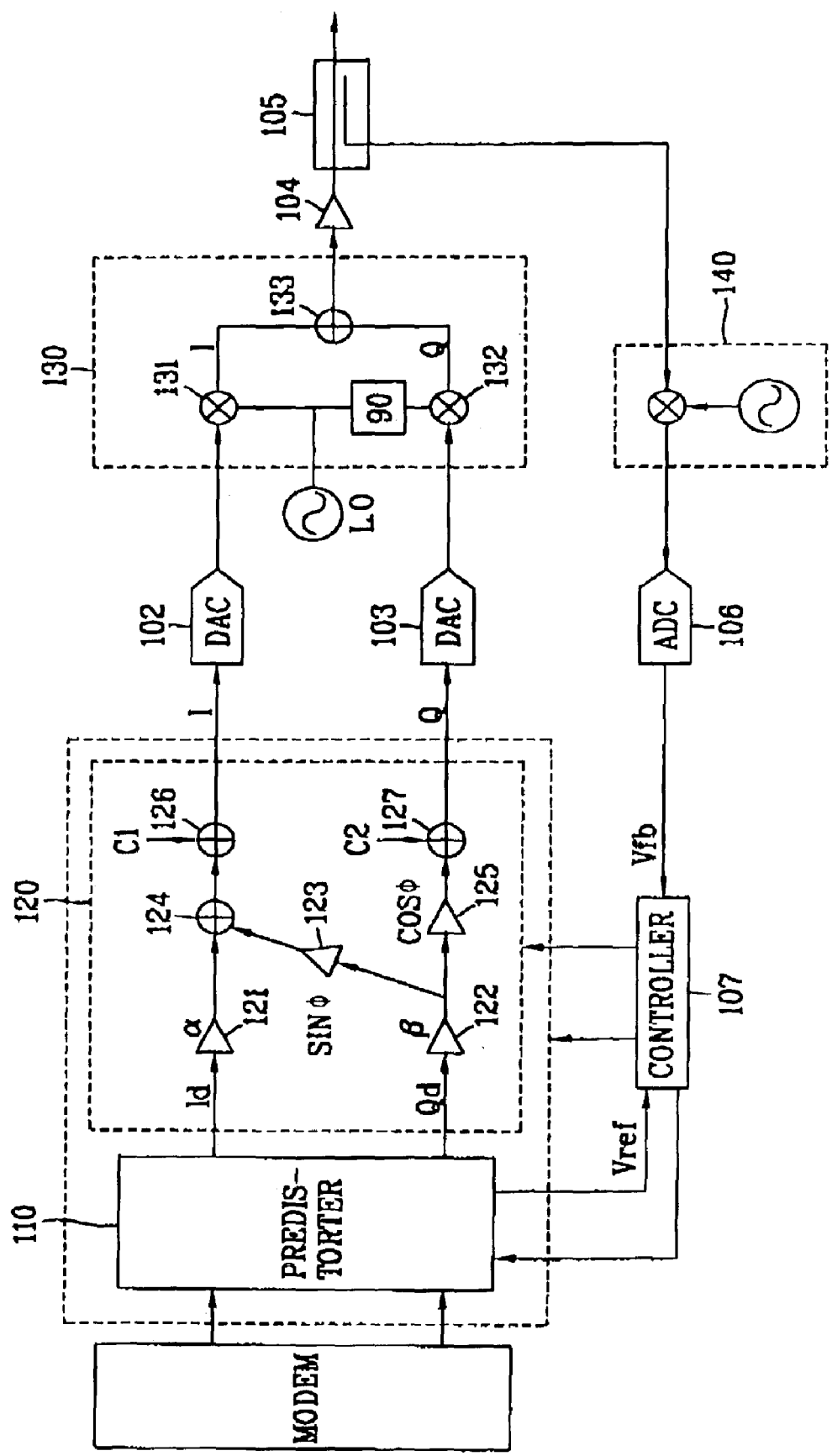
FIG. 1 is a block diagram showing a related art error compensating apparatus for AQM.
Figure 2:
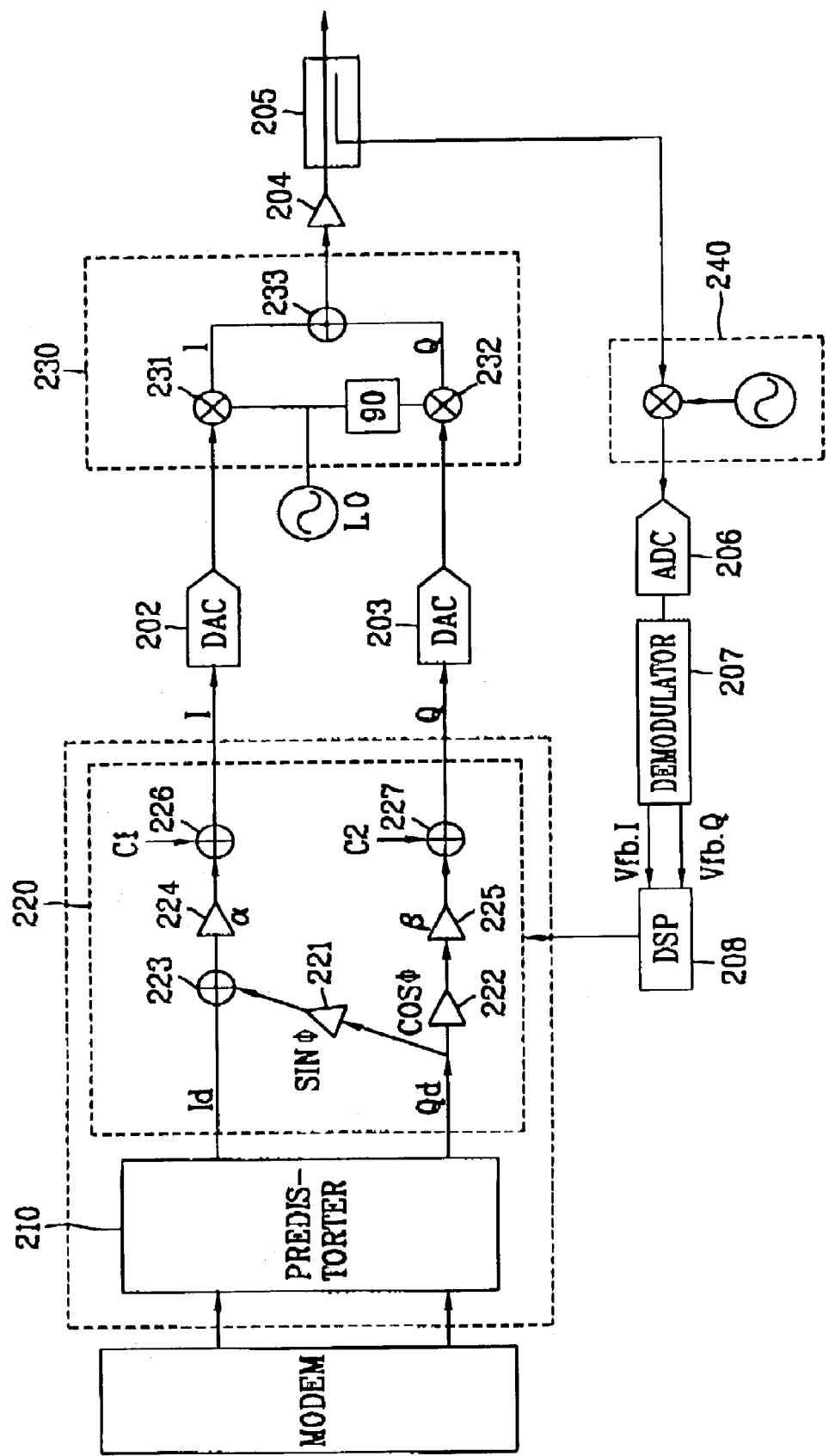
FIG. 2 is a block diagram showing an error compensating apparatus for AQM according to a preferred embodiment of the present invention.

FIG. 2 is a block diagram showing an error compensating apparatus for an AQM according to a preferred embodiment of the present invention. As shown in FIG. 2, the error compensating apparatus according to the preferred embodiment preferably includes a predistorter 210 for pre-distorting a digital input signal to have an opposite characteristic from that of a power amplifier's nonlinear distortion characteristic, an error compensating unit 220 for receiving the I/Q digital signals outputted from the predistorter 210 and compensating the signals in accordance with the error compensating signal, and a first and a second digital/analog converters 202 and 203 for converting the I/Q digital signals of the error compensating unit 220 into I/Q analog signals respectively. The apparatus preferably further includes a modulator 230 for modulating a frequency of the analog signals outputted from the first and second digital/analog converters 202 and 203, a power amplifier 204 for amplifying the output signal of the modulator 230 and supplying the signal to a directional coupler 205, and a down converter 240 for down converting a frequency of a signal branched and returned from the directional coupler 205. Further, the apparatus includes an analog/digital converter 206 for converting the output signals of the down converter 240 into digital signals, a demodulator 207 for demodulating the digital signal of the analog/digital converter 206 and outputting digital signals by dividing the signal into an I-digital signal and a Q-digital signal, and a digital signal processor (DSP) 208 calculating an AQM error compensating signal through the I/O digital signals ($V_{fb}\_I$, $V_{fb}\_Q$) of the demodulator 107. The DSP provides the error compensating signal to the error compensating unit 220.

The error compensating unit 220 preferably includes a first amplifier 221 for controlling a phase of the Q-digital signal by realizing the error compensating value transmitted from the digital signal processor 208 as a first phase compensating signal (sin φ), and a second amplifier 222 for controlling phase of the Q-digital signal by realizing a phase compensating value transmitted from the digital signal processor 208 as a second phase compensating signal (cos φ). The error compensating unit 220 further includes a first adder 223 for adding the pre-distorted I-digital signal to the output signal of the first amplifier, a third amplifier 224 for gain compensating the output signal of the first adder 223 according to the first gain compensating signal (α), and a fourth amplifier 225 for gain compensating the output signal of the second amplifier 222 according to the second gain compensating signal (β). It further preferably includes a second adder 226 for compensating the DC offset by adding the I-digital signal outputted from the third amplifier 224 and a first DC offset signal (C1), and a third adder 227 for compensating the DC offset by adding the Q-digital signal outputted from the fourth amplifier 225 to a second DC offset signal (C2).

The modulator 230 preferably includes a first multiplier 231 for multiplying an I-analog signal outputted from the first digital/analog converter 202 by a local oscillator frequency signal outputted from a local oscillator LO, a second multiplier 232 for multiplying a Q-analog signal outputted from the second digital/analog converter 203 by the local oscillator frequency signal outputted from the local oscillator LO, and a combiner 233 for outputting a high frequency signal by combining output signals of the first and second multiplier 231 and 232.

An operation of the AQM error compensating apparatus constructed as above according to the preferred embodiment will be described as follows. First, the predistorter 210 distorts the digital signals inputted through a modem into predistorted I/Q digital signals to have characteristics that are opposite of the nonlinear distortion characteristics of the power amplifier, and inputs the predistorted signals into the error compensating unit 220.

The error compensating unit 220 compensates the error of the I/Q digital signals outputted from the predistorter 210, and applies the signals to the first and second digital/analog converters 202 and 203. The first and second digital/analog converters 202 and 203 output the inputted I/Q digital signals as I/O analog signals.

The modulator 230 receives and AQM modulates the I/Q analog signals outputted from the first and second digital/analog converters 202 and 203. That is, the first multiplier 231 of the modulator 230 converts a frequency of the I-analog signal outputted from the first digital/analog converter 202 by multiplying it by the local oscillator LO, frequency signal outputted from the local oscillator, and the second multiplier 232 converts a frequency of the Q-analog signal outputted from the second digital/analog converter 203 by multiplying it by a signal having a phase difference of π/2 from the local oscillator signal. The respective signals, of which frequencies have been converted, are combined as a high frequency signal in the combiner 233 and applied to the power amplifier 204.

The down converter 240 receives and down converts the frequency of the signal which is returned from the directional coupler 205 after passing through the power amplifier 204, and provides the down converted signal to the analog/ digital converter 206. The analog/digital converter 206 converts the output signal of the down converter 240 into the digital signal and outputs the converted signal into the demodulator 207.

The demodulator 207 demodulates the digital signal received from the analog/digital converter 206 and outputs the signal as I/Q digital signals ($V_{fb}\_I$, $V_{fb}\_Q$). The digital signal processor 208 receives these signals and extracts the error value by performing a prescribed calculation with the I/Q digital signals of the demodulator 207. The DSP 208 then applies the error compensating signal for compensating the error value to the error compensating unit 220. In addition, the error compensating unit 220 compensates the errors of the I/Q digital signals according to the error compensating signals and outputs the signals.

At that time, the error compensating signal consists of first and second DC offset signals (C1 and C2) for compensating the DC offset of the I/Q digital signals, first and second gain compensating signals ($\alpha$ and $\beta$) for compensating gain error of the I/Q digital signals, and a phase compensating value ($\phi$) for compensating a error phase of the I/Q digital signals.

Figure 3:
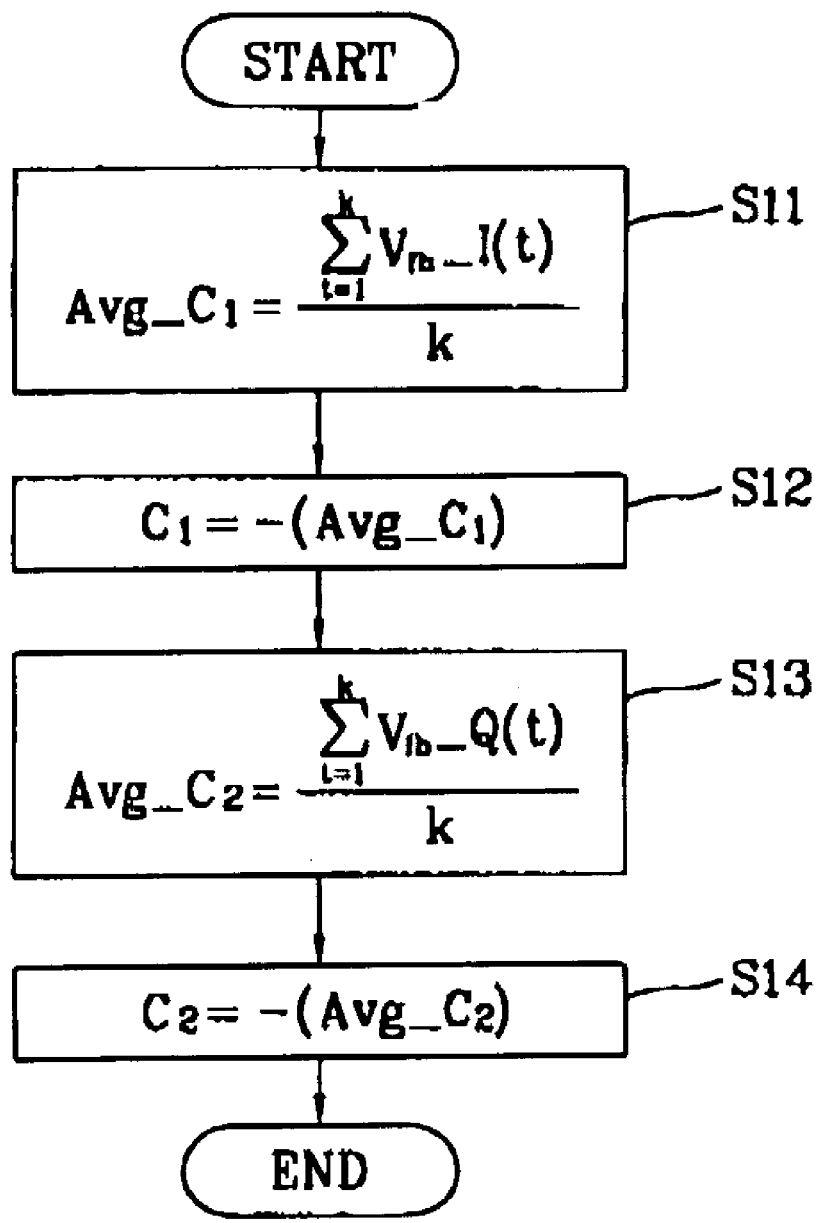
FIG. 3 is a flow chart showing a method for detecting a DC offset signal according to the preferred embodiment of the present invention.

FIG. 3 is a flow chart showing processes for detecting a DC offset signal in the AQM error compensating method according to the preferred embodiment.

The AQM error compensating method preferably includes detecting the DC offset signal through an average of sampling values after sampling the returned I/Q digital signals, detecting a gain compensating signal using maximum values in a period of the returned I/Q digital signals, and detecting a phase compensating value through an error with the phase of $\pi/2$ existing between the returned I-digital signal and the returned Q-digital signal.

Referring to FIG. 3, the digital signal processor 208 samples the returned I-digital signal $V_{fb}\_I$ and Q-digital signal $V_{fb}\_Q$ a prescribed number of times respectively, averages the sampled values respectively (S11 and S13), and detects the values as the first and second DC offset signals (C1 and C2) (S12 and S14). At that time, the number of samples is based on one period of the respective signal.

That is, averages of respective samples per one period for ideal I/Q digital signals should be zero (0). However, there is an error in the sample averages of the returned I/Q digital signals if there is included an error component in the I/Q digital signals respectively. A negative numbered value of the error becomes the compensating value of the DC offset.

Figure 4:
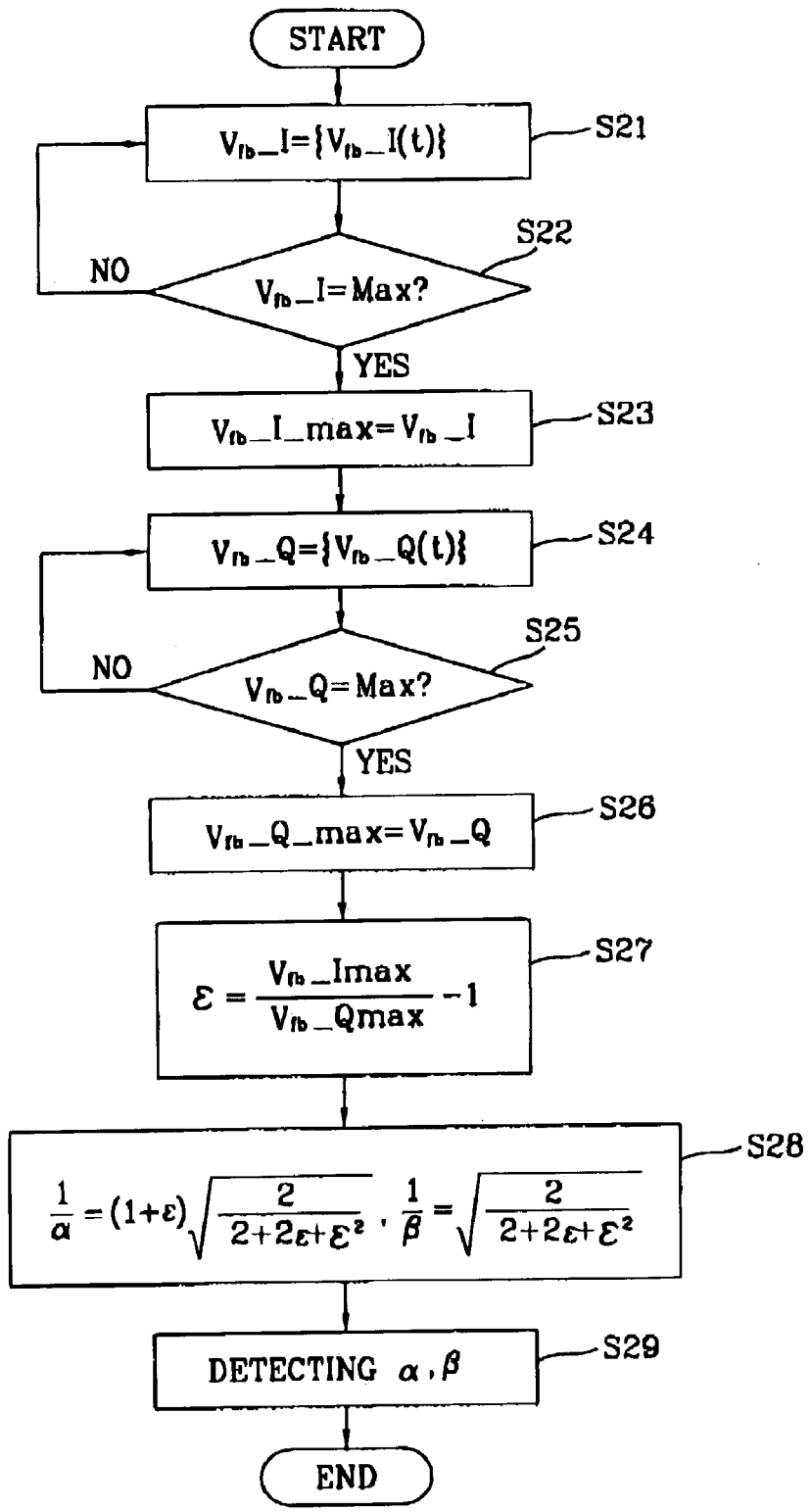
FIG. 4 is a flow chart showing a method for detecting a gain compensating signal according to the preferred embodiment of the present invention.

FIG. 4 is a flow chart showing a process for calculating the gain compensating signal in the AQM error compensating method according to the preferred embodiment.

As shown therein, maximum values of the I-digital signal and Q-digital signal, of which DC offsets have been removed, are first detected. The first and second gain compensating signals ($\alpha$ and $\beta$) are then calculated by performing a prescribed calculation with the maximum values, and the gains are compensated using the first and second gain compensating signals ($\alpha$ and $\beta$).

In more detail, maximum values during one period from the returned I-digital signal and the Q-digital signal are first detected (S21 through S26). After that, a gain error ($\epsilon$) is calculated according to equation 1 using a ratio of the maximum value of the I-digital signal to the maximum value of the Q-digital signal (S27). Next, the first gain compensating signal ($\alpha$) and the second gain compensating signal ($\beta$) are calculated using the gain error ($\epsilon$) according to equation 2 (S28 and S29). The ratio of the maximum value of the I-digital signal for the maximum value of the Q-digital signal is "1" in an ideal status where there is no error. Therefore, the gain error is 0.

$$\varepsilon = \frac{V_{fb} - I_{\max}}{V_{fb} - Q_{\max}} - 1 \quad \text{(equation 1)}$$

$$\frac{1}{\alpha} = (1+\varepsilon)\sqrt{\frac{2}{2+2\varepsilon+\varepsilon^2}} \quad \text{(equation 2)}$$

$$\frac{1}{\beta} = \sqrt{\frac{2}{2+2\varepsilon+\varepsilon^2}}$$

As shown above, equation 1 is for realizing the gain error, and equation 2 is for realizing the first gain compensating signal and the second gain compensating signal. Herein, $\epsilon$ represents the gain error.

The first gain compensating signal ($\alpha$) and the second gain compensating signal ($\beta$) realized through equations 1 and 2 are preferably applied to the error compensating unit 220 (FIG. 2) to compensate the gains of the I/Q digital signals.

Figure 5:
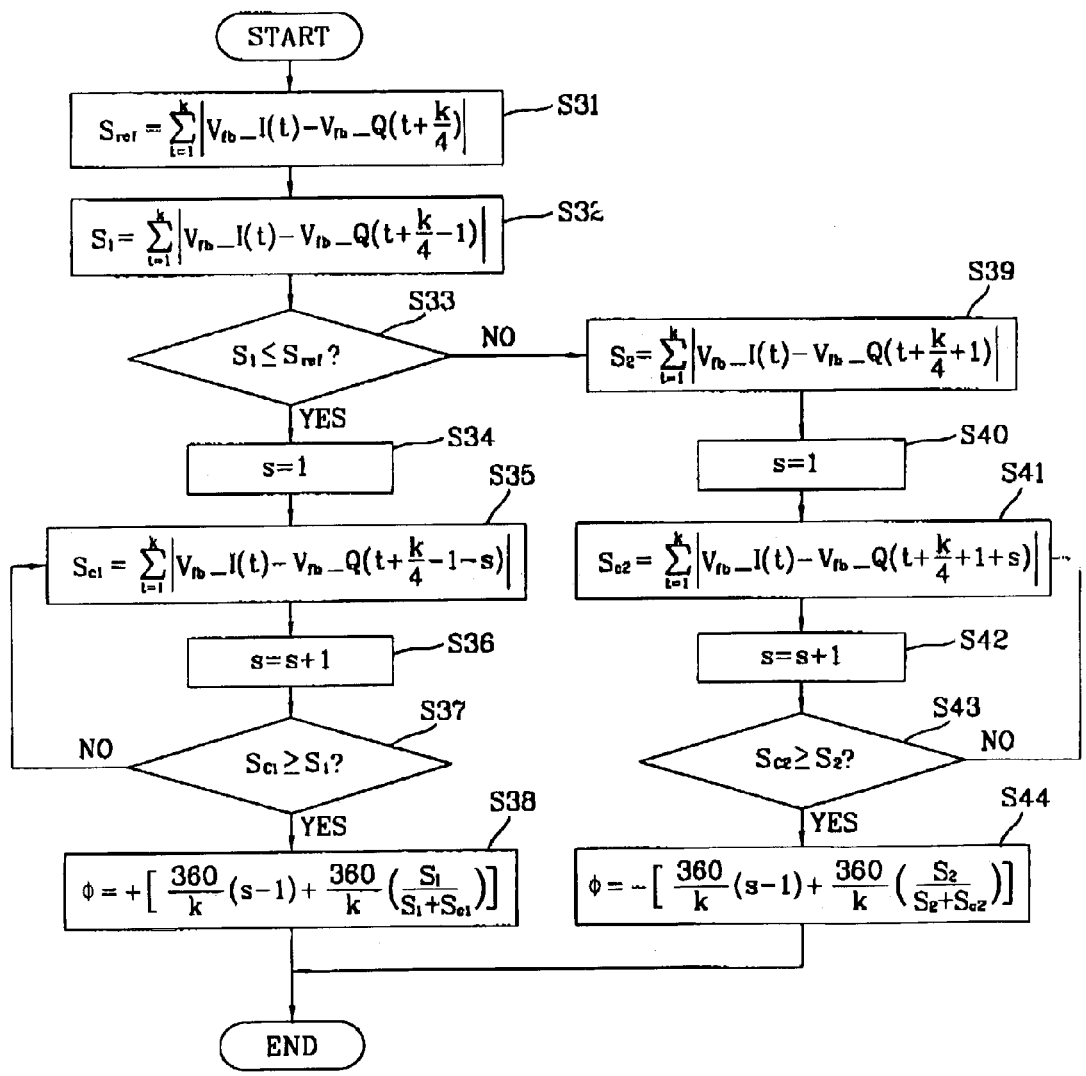
FIG. 5 is a flow chart showing a method for detecting a phase compensating value according to the preferred embodiment of the present invention.

FIG. 5 is a flow chart showing a process of calculating a phase compensating value in the AQM error compensating method according to the preferred embodiment.

As shown in FIG. 5, a sum of absolute values of difference between the I-digital signal and the Q-digital signal of which the gains are compensated by the gain compensating signal is first calculated. The phase compensating value ($\phi$) of the feedback I/Q digital signals is then calculated based on the sum.

The I-digital signal and the Q-digital signal, making cosine and sine curves respectively, shows a phase difference of $\pi/2$ in an ideal case. Therefore, the two signals should be overlapped when the Q-digital signal is shifted by $-\pi/2$. However, if a phase error has occurred between the I-digital signal and the Q-digital signal, the two signals will not overlap perfectly, and an error component is generated.

Thus, as shown in FIG. 5, a difference value between the I-digital signal and the Q-digital signal is calculated by summing the absolute value of the differences according to equation 3. This value is set as a reference sum S reference (S31).

$$S_{ref} = \sum_{t=1}^{k} \left| V_{fb}\_I(t) - V_{fb}\_Q\left(t + \frac{k}{4}\right) \right| \quad \text{(equation 3)}$$

Equation 3 determines the reference sum, and k represents the number of samplings in one period.

In addition, if the phase difference between the I/Q signals is smaller than the phase difference of the reference sum, the absolute value for the difference of the I-digital signal and the Q-digital signal is calculated according to equation 4, and the sum of the absolute values is set as a first basic sum (S32).

$$S_1 = \sum_{t=1}^{k} \left| V_{fb}\_I(t) - V_{fb}\_Q\left(t + \frac{k}{4} - 1\right) \right| \quad \text{(equation 4)}$$

Equation 4 realizes the first basic sum, the absolute value for the difference between the Q-digital signal moving by as much as one sampling interval to positive direction and the I-digital signal is calculated, and the sum of the absolute values is calculated.

Next, it is determined that whether or not the reference sum is greater than or equal to the first basic sum (S33). If so, a first comparing sum Sc1 is calculated according to equation 5 (S34 and S35). The first comparing sum Sc1 is a sum of absolute values of differences between the Q-digital signal, which is shifted by as much as a sampling interval toward the positive direction, and the I-digital signal. At that time, a phase difference smaller than $\pi/2$ is generated between the I-digital signal and the Q-digital signal.

The sampling interval where the difference between the signals is at a minimum is calculated by comparing the first basic sum to the first comparing sum (S36 and S37), and the phase compensating value is calculated according to equation 6 using the first basic sum and the second comparing sum (S38).

$$S_{c1} = \sum_{t=1}^{k} \left| V_{fb} - I(t) - V_{fb} - Q\left(t + \frac{k}{4} - 1 - s\right) \right| \quad \text{(equation 5)}$$

$$\phi = +\left[ \frac{360}{k}(s-1) + \frac{360}{k}\left(\frac{S_1}{S_1 + S_{c1}}\right) \right] \quad \text{(equation 6)}$$

Equations 5 and 6 are used to calculate the first comparing sum and the phase compensating value, where k represents the number of samples in one period and s represents sampling interval.

If, at step S33, the first basic sum is determined to be larger than the reference sum, the second basic sum $S_2$ is calculated using equation 7 (S39). The second basic sum $S_2$ is obtained by summing the absolute values of a difference between the Q-digital signal, which is shifted by as much as one sampling interval toward negative direction, and the I-digital signal. At that time, a phase difference larger than $\pi/2$ is generated between the I-digital signal and the Q-digital signal.

$$S_2 = \sum_{t=1}^{k} \left| V_{fb} - I(t) - V_{fb} - Q\left(t + \frac{k}{4} + 1\right) \right| \quad \text{(equation 7)}$$

Equation 7 is used to calculate the second basic sum $S_2$, where k represents the number of samplings in one period.

After calculating the second basic sum $S_2$, a second comparing sum $S_{c2}$ is obtained by calculating a sum of absolute values for the difference between the Q-digital signal, which is shifted by as much as the sampling interval toward negative direction, and the I-digital signal, according to equation 8 (S40 and S41). It is next determined whether the second comparing sum $S_{c2}$ is greater than or equal to the second basic sum, where the second comparing sum is calculated by moving the sampling intervals one by one toward the positive direction when the second comparing sum is less than the second basic sum (S42 and S43). The sampling interval where the difference between two signals is at a minimum, the second basic sum and the second comparing sum are calculated by comparing the second basic sum $S_2$ to the second comparing sum $S_{c2}$. Using the values of $S_2$ and $S_{c2}$, the phase compensating value is calculated according to equation 9 (S44).

$$S_{c2} = \sum_{t=1}^{k} \left| V_{fb} - I(t) - V_{fb} - Q\left(t + \frac{k}{4} + 1 + s\right) \right| \quad \text{(equation 8)}$$

$$\phi = -\left[ \frac{360}{k}(s-1) + \frac{360}{k}\left(\frac{S_1}{S_1 + S_{c2}}\right) \right] \quad \text{(equation 9)}$$

Equations 8 and 9 are thus used to calculate the second comparing sum and the phase compensating value, where k represents the number of samplings in one period and s represents the sampling interval.

The DC offset signals (C1 and C2), gain compensating signals ($\alpha$ and $\beta$), and the phase compensating value ($\phi$) are applied to the error compensating unit 220 (FIG. 2) to compensate the phase error of the inputted signal. After that, the gain error is compensated, and the DC offset is removed. The AQM errors are compensated in the above order.

Figure 6A:
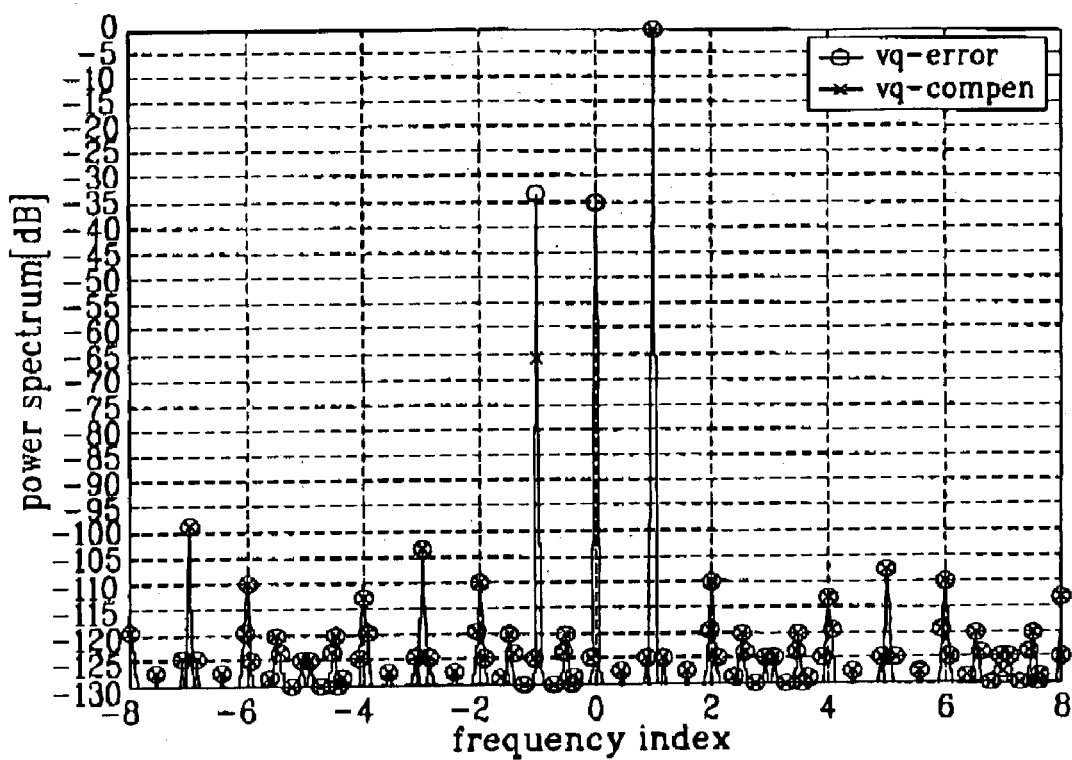
FIGS. 6a and 6b are graphs showing simulation results of error compensating units of the related art and the preferred embodiment of the present invention, respectively.
Figure 6B:
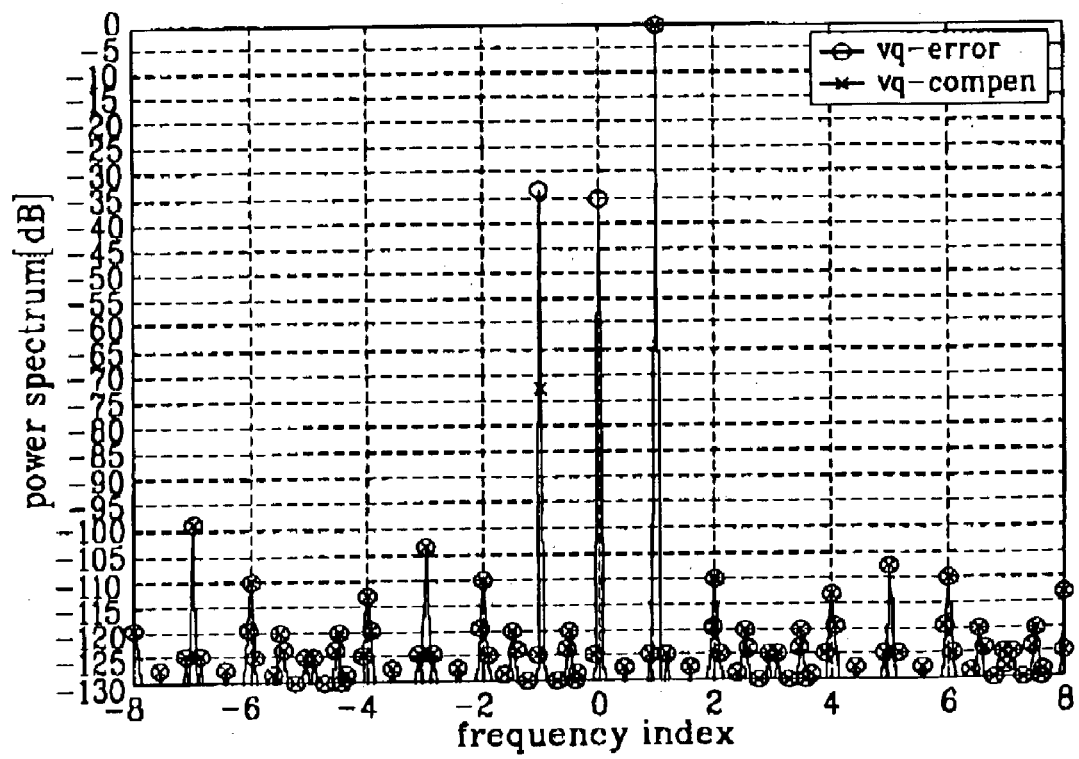

FIG. 6A illustrates the simulation results of the related art error compensating unit and FIG. 6B illustrates the simulation results of the error compensating unit according to the preferred embodiment.

Equations 10 and 11 describe the calculation of signals compensated in the related art error compensating method and in the error compensating method according to the preferred embodiment, respectively.

$I\text{-signal} = I\alpha + Q\beta \sin\phi + C_1$ \hfill (equation 10)

$Q\text{-signal} = Q\beta \cos\phi + C_2$ $I\text{-signal} = I\alpha + Q\alpha \sin\phi + C_1$ \hfill (equation 11)

$Q\text{-signal} = Q\beta \cos\phi + C_2$

When comparing equations 10 and 11, there is a difference of $Q\beta \sin\phi$ versus $Q\alpha \sin\phi$ for the I-signal. The related art I-signal uses $\beta$, that is, the Q-signal component, and thereby a precise compensation can not be made. In other words, $\alpha$ is a value calculated for compensating the gain error of the I-signal, and $\beta$ of Q-signal component is added to the I-signal. Therefore, it cannot determine a precise error compensation value.

The AQM error compensating apparatus according to the present invention has various advantages. For example, the phase error is compensated first and the gain error is then compensated. The preferred embodiment is thus able to improve a separation degree between the I-signal and the Q-signal. Therefore, the error can be improved as much as 7 dB as shown in FIG. 6B.

Additionally, the apparatus and the method for compensating the error of AQM according to the preferred embodiment measures the AQM error using only the feedback I/Q digital data. Therefore, the error can be detected and compensated without needing additional memory.

Also, according to the apparatus and method for compensating the error of AQM of the preferred embodiment, the phase compensation is made earlier than the gain compensation, and independent functions between the gain and phase can be performed. The precise error compensation can thereby be made.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An error compensating apparatus for an analog quadrature modulator (AQM), comprising:
   an error compensating unit configured to compensate predistorted I/Q digital signals according to an error compensating signal;
   a digital/analog converter coupled to convert outputted I/Q digital signals from the error compensating unit into I/Q analog signals;
   a modulator coupled to frequency modulate the I/Q analog signals outputted from the digital/analog converter;
   a power amplifier coupled to amplify an output signal of the modulator;
   a down converter to down convert a frequency of a signal coupled from the power amplifier;
   an analog/digital converter coupled to convert an analog output signal of the down converter into a digital signal;
   a demodulator coupled to divide the digital signal received from the analog/digital converter into I/Q digital signals; and
   a digital signal processor configured to calculate an error compensating signal by processing the I/Q digital signals outputted from the demodulator, and provide the error compensating signal to the error compensating unit,
   wherein the digital signal processor detects a DC offset signal by averaging sampling values of the I/Q digital signals outputted from the demodulator, and
   wherein the error compensating unit detects a gain compensating signal using a maximum value in a period of the I/Q digital signals of which the DC offset is compensated, detects a phase compensating value of the I/Q digital signals based on a sum of absolute values for differences between the gain compensated I-digital signals and Q-digital signals, and compensates AQM error by removing a gain error and the DC offset, after compensating a phase error of the inputted digital signal.

2. The apparatus of claim 1, further comprising a predistortor coupled to receive a digital I/Q input signal & distort a non-linear distortion characterisitc of the digital I/Q input signal to generate the predistorted digital I/Q signal.

3. The apparatus of claim 1, wherein the error compensating signal comprises:
   a phase compensating value to compensate a phase of the predistorted I/Q digital signals;
   first and second gain compensating signals to compensating gain of the I/Q digital signals; and
   first and second DC offset signals to compensate a DC offset of the predistorted I/Q digital signals.

4. The apparatus of claim 1, wherein the error compensating unit comprises:
   first and second amplifiers configured to compensate the pre-distorted Q-digital signal according to a phase compensating value;
   a first adder configured to add the pre-distorted I-digital signal to an output signal of the first amplifier;
   a third amplifier configured to compensate an output signal of the first adder according to a first gain compensating signal;
   a fourth amplifier configured to compensate an output signal of the second amplifier according to a second gain compensating signal;
   a second adder configured to add an output signal of the third amplifier to a first DC offset signal; and
   a third adder configured to adding an output signal of the fourth amplifier to a second DC offset signal.

5. The apparatus of claim 4, wherein the phase compensating value, the first and second gain compensating signals, and the first and second DC offset signals compile the error compensating signal.

6. The apparatus of claim 4, wherein the phase compensating value is converted into a sine value and a cosine value by being inputted into the first and second amplifiers.

7. The apparatus of claim 1, wherein the digital signal processor calculates the error compensating signal using the returned I/Q digital signals.

8. A method of compensating error of an Analog Quadrature Modulator (AQM), comprising:
   dividing a returned digital signal into I/Q digital signals and outputting the I/Q digital signals;
   calculating an error compensating signal by performing a prescribed calculation with the I/Q digital signals; and
   compensating an error of an inputted signal by applying the calculated error compensating signal,
   wherein calculating the error compensating signal comprises calculating DC offset signals for the returned I/O digital signals, calculating a phase compensating value for compensating a phase of the I/O digital signals, and calculating a gain compensating signal for compensating a gain of the I/O digital signals after the calculating the phase compensating value.

9. The method of claim 8, wherein the error compensating signal is applied to pre-distorted I/Q digital signals.

10. The method of claim 9, wherein the pre-distorted signal has a distortion characteristic that is opposite of a distortion characteristic of a power amplifier.

11. The method of claim 8, wherein the error compensating signal comprises:
    a phase compensating value for compensating a phase of the I/Q digital signals;
    first and second gain compensating signals for compensating a gain of the I/Q digital signals; and
    first and second DC offset signals for compensating a DC offset of the I/Q digital signals.

12. The method of claim 8, wherein applying the error compensating signal comprises:
    compensating a phase of the respective I/Q digital signals inputted from a predistorter;
    compensating a gain of the I/Q digital signals of which the phases have been compensated; and
    compensating a DC offset of the I/Q digital signals of which the gains have been compensated.

13. The method of claim 8, wherein calculating the DC offset signal comprises:
    sampling respective returned I/Q digital signals at a prescribed rate to obtain a prescribed number of samples;
    calculating averages of respective sampling values; and
    identifying negative numbered values of the averages as the DC offset signals.

14. The method of claim 8, wherein calculating the gain compensating signal comprises:

detecting maximum values of the I-digital signal and Q-digital signal in a period;
calculating gain error using a ratio between the respective maximum values; and
determining respective gain compensating signals by calculating the gain error in a prescribed manner way.

15. The method of claim 14, wherein a first gain compensating signal is calculated by taking an inverse of $$\frac{1}{\alpha} = (1+\varepsilon)\sqrt{\frac{2}{2+2\varepsilon+\varepsilon^2}},$$

and wherein a second gain compensating value is calculated by taking an inverse of $$\frac{1}{\alpha} = (1+\varepsilon)\sqrt{\frac{2}{2+2\varepsilon+\varepsilon^2}},$$

where $\varepsilon$ is the gain error.

16. The method of claim 8, wherein calculating the phase compensating value comprises:
calculating a first absolute value for a difference between the I-digital signal and the Q-digital signal shifted by as much as $\pi/2$, and setting a sum of the first absolute values as a reference sum;
calculating a second absolute value for a difference between the I-digital signal and the Q-digital signal shifted by as much as one sampling interval, and setting a sum of the second absolute values as a basic sum;
calculating a third absolute value for a difference between the I-digital signal and the Q-digital signal shifted by as much as two or more sampling intervals, and setting a sum of the third absolute values as a comparing sum; and
extracting the phase compensating value using the sampling interval when the comparing sum is greater than or equal to the basic sum.

17. The method of claim 16, wherein if the reference sum is greater than the basic sum, then the phase difference between the I-digital signal and the Q-digital signal is less than $\pi/2$.

18. The method of claim 16, wherein if the reference sum is less than the basic sum, the phase difference between the I-digital signal and the Q-digital signal is greater than $\pi/2$.

19. A method of compensating error of an Analog Quadrture Modulator (AQM), comprising:
detecting a DC offset signal by averaging sampling values of returned I/Q digital signals;
detecting a gain compensating signal using a maximum value in a period of the I/Q digital signals of which the DC offset is compensated;
detecting a phase compensating value of the I/Q digital signals based on a sum of absolute values for differences between the gain compensated I-digital signals and Q-digital signals; and
compensating AQM error by removing a gain error and the DC offset, after compensating a phase error of the inputted digital signal.

20. The method of claim 19, wherein detecting the DC offset signal comprises:
sampling the returned I/Q digital signals a prescribed number of times;
calculating an average of the respective sampling values; and
determining negative numbered values of the average as the DC offset signal.

21. The method of claim 19, wherein calculating the gain compensating signal comprises:
detecting maximum values of the I-digital signal and the Q-digital signal in one period;
calculating the gain error using a ratio between the respective maximum values; and
determining a first gain compensating signal and a second gain compensating signal calculating the gain error in predetermined way.

22. The method of claim 21, wherein the gain error is realized through following equation;

$$\varepsilon = \frac{V_{fb} - I_{\max}}{V_{fb} - Q_{\max}} - 1,$$

wherein $\varepsilon$ is the gain error.

23. The method of claim 21, wherein the first gain compensating signal and the second gain compensating signal are realized through following equations;

$$\frac{1}{\alpha} = (1+\varepsilon)\sqrt{\frac{2}{2+2\varepsilon+\varepsilon^2}} \quad \frac{1}{\beta} = \sqrt{\frac{2}{2+2\varepsilon+\varepsilon^2}}$$

wherein, $\alpha$ and $\beta$ represent the first and second gain compensating signals, respectively, and $\varepsilon$ represents the gain error.

24. The method of claim 19, wherein detecting the phase compensating value comprises:
calculating absolute values for differences of the I-digital signal and the Q-digital signal which is shifted by as much as $\pi/2$, and setting a sum of the so calculated absolute values as a reference sum;
calculating absolute values for differences of the I-digital signal and the Q-digital signal which is shifted by as much as a sampling interval, and setting a sum of the so calculated absolute values as a first basic sum;
comparing the reference sum to the first basic sum;
calculating a first comparing sum when the reference sum is greater than or equal to the first basic sum, and extracting the phase compensating value using a prescribed sampling interval when the first comparing sum is greater than or equal to as the first basic sum, the phase compensates the first basic sum and the first comparing sum;
calculating absolute value for difference between the I-digital signal and the Q-digital signal, which is shifted by as much as one sampling interval, when the reference sum is smaller than the first basic sum, and setting a sum of the absolute values as a second basic sum; and
calculating a second comparing sum by moving the sampling interval of the Q-digital signal, and extracting the phase compensating value using a sampling interval when the second comparing sum is greater than or equal to as the second basic sum, the phase compensating value being calculated base on the second basic sum and the second comparing sum.

25. The method of claim 24, wherein the Q-digital signals of the first basic sum and the second basic sum are shifted in a opposite direction with each other.

26. The method of claim 24, wherein the reference sum is realized through following equation;

$$S_{ref} = \sum_{t=1}^{k} \left| V_{fb} - I(t) - V_{fb} - Q\left(t + \frac{k}{4}\right) \right|$$

wherein Sref is the reference sum.

27. The method of claim 24, wherein the first basic sum is realized through following equation;

$$S_1 = \sum_{t=1}^{k} \left| V_{fb} - I(t) - V_{fb} - Q\left(t + \frac{k}{4} - 1\right) \right|$$

wherein $S_1$, is the 1st basic sum.

28. The method of claim 24, wherein the second basic sum is realized through following equation;

$$S_2 = \sum_{t=1}^{k} \left| V_{fb} - I(t) - V_{fb} - Q\left(t + \frac{k}{4} + 1\right) \right|,$$

wherein, $S_2$ is the second basic sum and k is a number of samplings in one period.

29. The method of claim 24, wherein the first comparing sum is realized through following equation;

$$S_{c1} = \sum_{t=1}^{k} \left| V_{fb} - I(t) - V_{fb} - Q\left(t + \frac{k}{4} - 1 - s\right) \right|,$$

wherein, $S_{c1}$ is the first comparing sum, k is a number of samples in one period, and s is the sampling interval.

30. The method of claim 24, wherein the second comparing sum is realized through following equation;

$$S_{c2} = \sum_{t=1}^{k} \left| V_{fb} - I(t) - V_{fb} - Q\left(t + \frac{k}{4} + 1 + s\right) \right|,$$

wherein, $S_{c2}$ is the second comparing sum, k a the number of samples in one period, and s is the sampling interval.

31. The method of claim 24, wherein the phase compensating value φ extracted using the first basic sum and the first comparing sum is realized through following equation;

$$\phi = +\left[ \frac{360}{k}(s-1) + \frac{360}{k}\left(\frac{S_1}{S_1 + S_{c1}}\right) \right],$$

wherein, k is the number of samplings in one period, s is the sampling interval, $S_1$ is the first basic sum, and $S_{c1}$ the second basic sum.

32. The method of claim 24, wherein the phase compensating value φ extracted using the second basic sum and the second comparing sum is realized through following equation;

$$\phi = -\left[ \frac{360}{k}(s-1) + \frac{360}{k}\left(\frac{S_2}{S_2 + S_{c2}}\right) \right],$$

wherein, k is the number of samplings in one period, s is the sampling interval, $S_2$ is the first basic sum, and $S_{c2}$ is the second basic sum.

* * * * *